(12) United States Patent
Arai et al.

(10) Patent No.: US 6,333,065 B1
(45) Date of Patent: *Dec. 25, 2001

(54) PROCESS FOR THE PRODUCTION OF AN ORGANIC ELECTROLUMINESCENT DEVICE

(75) Inventors: Michio Arai, Tokyo; Kenji Nakaya, Chiba, both of (JP)

(73) Assignee: TDK Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/116,965

(22) Filed: Jul. 17, 1998

(30) Foreign Application Priority Data

Jul. 25, 1997 (JP) .................................. 9-215758

(51) Int. Cl.[7] .................... B05D 3/04; B05D 5/06; B05D 5/12
(52) U.S. Cl. ...................... 427/66; 427/535; 427/539
(58) Field of Search .................. 427/58, 66, 68, 427/64, 532, 533, 534, 535, 539

(56) References Cited

U.S. PATENT DOCUMENTS

| | | | |
|---|---|---|---|
| 4,872,947 | * 10/1989 | Wang et al. | 427/38 |
| 4,892,753 | * 1/1990 | Wang et al. | 427/38 |
| 4,895,291 | * 1/1990 | Ozimek et al. | 228/121 |
| 5,505,985 | * 4/1996 | Nakamura et al. | 427/66 |
| 5,674,635 | * 10/1997 | Hsieh et al. | 427/66 |
| 5,792,326 | * 8/1998 | Harada et al. | 427/255.3 |
| 5,817,431 | * 10/1998 | Shi et al. | 428/690 |
| 5,963,826 | * 10/1999 | Takanabe et al. | 438/622 |
| 6,001,413 | * 12/1999 | Matsuura et al. | 427/64 |
| 6,020,078 | * 2/2000 | Chen et al. | 428/690 |
| 6,034,755 | * 3/2000 | Watanabe | 349/118 |

FOREIGN PATENT DOCUMENTS 7-142168   6/1995   (JP) .

* cited by examiner

Primary Examiner—Shrive P. Beck
Assistant Examiner—Michael Cleveland
(74) Attorney, Agent, or Firm—Oblon, Spivak, McClelland, Maier & Neustadt, P.C.

(57) ABSTRACT

An apparatus and a process for the production of an organic EL device, which permits a high freedom of apparatus designing, permits effective processing and gives an organic EL device having a high light emission efficiency and excellent device characteristics, the apparatus comprising means of cleaning a surface of a substrate on which at least a hole-injecting electrode is formed, and means of forming an organic layer on the cleaned surface of the substrate, the cleaning means being for performing the cleaning with ozone gas generated with the ozonizer.

17 Claims, 1 Drawing Sheet

PROCESS FOR THE PRODUCTION OF AN ORGANIC ELECTROLUMINESCENT DEVICE

FIELD OF THE INVENTION

The present invention relates to an organic EL device using an organic compound, and more specifically, it relates to an improvement of an interface between the hole-injecting electrode and the organic layer of an organic EL device.

PRIOR ART

In recent years, organic EL devices have been actively studied. Organic EL devices have a basic configuration structured by vaporizing a hole-transporting material such as triphenyldiamine (TPD) to form a thin film on a hole-injecting electrode, further laminating a light-emitting layer of a fluorescent material such as an aluminum quinol complex (Alq3) and further forming a metal electrode (electron-injecting electrode) having a low work function such as Mg. These organic EL devices are attracting attention due to their capability of a very high luminance of several 100 to several 10,000 cd/m$^2$ at a voltage of about 10 V.

It is considered that a material capable of injecting many holes into a light-emitting layer or a hole-injecting/transporting layer is effective for use in an hole-injecting electrode of the above organic EL devices. In most configurations, generally, emitted light is arranged to come out through a substrate side, and the material for hole-injecting electrode is required to be a transparent electrically conductive material.

For the above transparent electrode, there are known ITO (tin-doped indium oxide), IZO (zinc-doped indium oxide), ZnO, SnO$_2$, In$_2$O$_3$ and the like. Of these, an ITO electrode is a transparent electrode having a visible light transmittance of at least 90% and a sheet resistance of 10Ω/□ or less, and it is widely used as a transparent electrode for a liquid crystal display (LCD), dimmer glass and a solar cell and is expected to be promising as a hole-injecting electrode of an organic EL device.

Meanwhile, an organic EL device tends to deteriorate with the passage of time, and it is an essential object how to prevent the deterioration. There are many factors which are considered to deteriorate the device. The deterioration in the film interface between the electrode and the organic layer has a great influence on the lifetime and the light-emission characteristic of the device, and it is an essential object to modify the device in property with regard to the above interface.

An organic EL device is constituted by forming a film of a hole-injecting electrode from the above ITO, etc. on a substrate, then forming organic layers such as a hole-injection and transporting layer and a light-emitting layer and further forming an electron-injecting electrode. When the hole-injecting electrode surface is contaminated during the formation of the organic layer after the layer of the hole-injecting electrode is formed, the efficiency of hole injection into the formed organic layer decreases. As a result, the light emission efficiency is caused to decrease, and a light-non-emitting area called a dark spot is caused to appear or a dark spot is caused to expand. Particularly, the hole-injecting electrode formed of ITO, etc., is produced in a step separate from the production step of the organic layers, or hole injecting electrodes manufactured by other manufacturer are purchased, in many cases. The surface thereof is often contaminated, and a cleaning step is therefore essential.

Attempts have been made in various ways to clean the surface of a substrate after the formation of the hole-injecting electrode. In one method, for example, a UV lamp is provided in a layer-forming chamber, it is turned on, and O$_2$ gas is introduced to carry out UVO$_3$ cleaning. However, the above method has problems that the layer-forming chamber is required to share a space with the UV lamp and that the freedom of machine designing is decreased due to the location of the UV lamp. Further, O$_3$ is generated in the layer-forming chamber, and the above method is therefore not satisfactory with respect of process capacity and process speed.

SUMMARY OF THE INVENTION

It is an object of the present invention to provide an apparatus and a process for an organic EL device, which permits a high freedom of apparatus designing, permits effective processing and gives an organic EL device having a high light emission efficiency and excellent device characteristics.

According to the present invention, the above object is achieved by any one of the following constitutions (1) to (3).

(1) An apparatus for producing an organic EL device, comprising
  means of cleaning a surface of a substrate on which at least a hole-injecting electrode is formed, and
  means of forming an organic layer on the cleaned surface of the substrate,
  the cleaning means being for performing the cleaning with ozone gas generated with an ozonizer under a reduced pressure of $1.33 \times 10^4$ Pa or less.

(2) In the above apparatus (1), the ozonizer is located by separating it from a layer-forming chamber.

(3) A process for the production of an organic EL device, comprising
  forming a hole-injecting electrode on a substrate,
  cleaning the substrate on which the hole-injecting electrode is formed, with ozone generated with an ozonier, and
  forming an organic layer within 60 minutes from the cleaning.

DETAILED DESCRIPTION OF THE INVENTION

The present invention will be explained in detail hereinafter.

The apparatus for producing an organic EL device, provided by the present invention, has electrode-forming means of forming at least a hole-injecting electrode on a substrate, cleaning means of cleaning the substrate surface after the formation of the above hole-injecting electrode and organic-layer-forming means of forming an organic layer after the cleaning of the substrate surface, the cleaning means being for performing the cleaning with ozone generated with an ozonizer. The ozonizer can generate a high concentration of ozone in a large amount, and the process speed is therefore improved. Further, it is not required to locate the ozonizer in the layer-forming chamber, and the location can be selected as required, so that the freedom of apparatus designing increases.

Further, since the cleaning is carried out under a reduced pressure of $1.33 \times 10^4$ Pa or less, preferably $1.33 \times 10^3$ Pa, successive operations in layer-forming steps are eased and the work efficiency is improved. Although not specially limited, the lower limit of the reduced pressure for the cleaning is approximately $1.33 \times 10^2$.

The ozonizer used in the present invention refers to an ozone-generating apparatus, and it has a discharge cell inside. When oxygen gas is flowed in the discharge cell, and when a high voltage is applied to the discharge cell, a voltage is generated by silent discharge caused by the application of the high voltage. Further, since the ozone concentration can be controlled on the basis of the applied voltage, it is easy to control the ozone concentration.

Although differing depending upon the flow amount of feed gas and inputted power, the amount of ozone that can be generated with the ozonizer is generally in the range of from 1 to 30 g/h. In the present invention, the ozone concentration is at least 1 g/h, particularly preferably in the range of from 5 to 10 g/h. The feed gas is $O_2$ or $O_3+N_2$ gases. The flow rate of the feed gas is not specially limited. Generally preferably, however, the flow rate of $O_2$ gas is 3 Nl/minute or less, and when $O_2+N_2$ gases are used, the flow rate of $O_2$ gas is 3 Nl/minute or less and the flow rate of $N_2$ gas is 30 Ncc/minute or less. The concentration of generated ozone is increased by adding $N_2$ gas, and a gas mixture with $N_2$ gas is therefore preferred. For example, when the flow rate of $O_2$ gas is 3 Nl/minute, the amount of generated ozone is approximately 25 g/h, and when the flow rates are 3 Nl/minute of $O_2$ and 30 Ncc/minute of $N_2$, the amount of generated ozone is approximately 20 g/h.

The time period for the cleaning is preferably 1 to 15 minutes, more preferably 1 to 10 minutes, particularly preferably 2 to 5 minutes.

Ozone gas generated with the ozonizer is preferably supplied close to the surface of a substrate on which a hole-injecting electrode of ITO, etc., is formed, to oxidize and clean the substrate surface, whereby organic substances, etc., adhering to the substrate surface are removed, an organic layer can be formed on the hole-injecting electrode in a clean state, and desired performances can be easily attained. The smaller the time period from the ozone cleaning to the formation of the organic layer, the better. The above time period is preferably within 60 minutes, more preferably within 30 minutes, particularly preferably 10 to 30 minutes.

One constitution example of the apparatus of the present invention will be explained with reference to drawings hereinafter.

Figure 1:
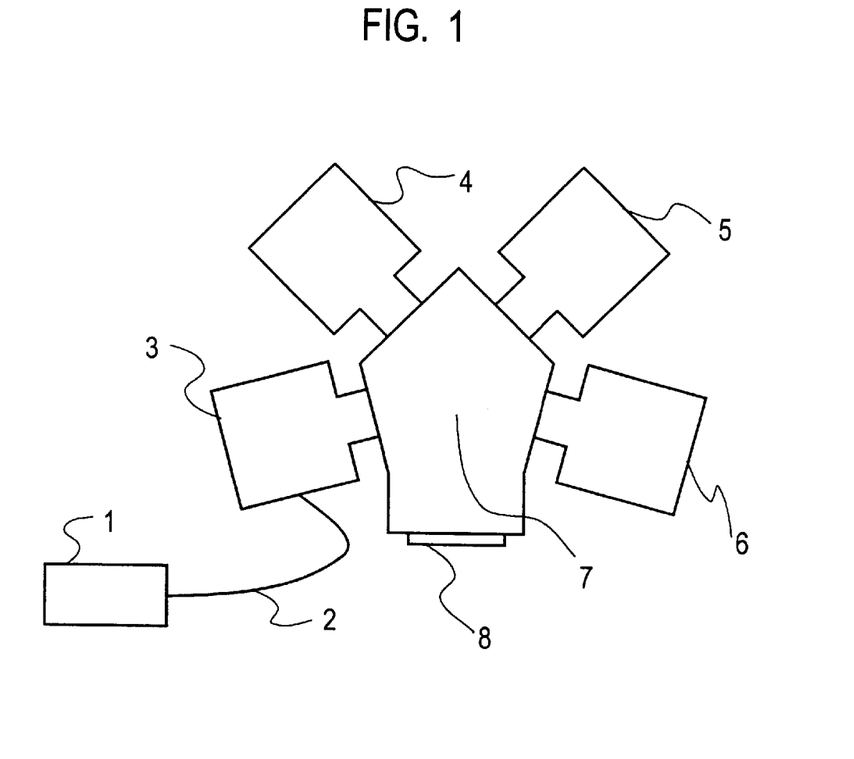
FIG. 1 is a schematic view of one constitution example of the apparatus using an ozonizer for producing an organic EL device, provided by the present invention.

FIG. 1 is a schematic view of one constitution example of the apparatus for producing an organic EL device, provided by the present invention. In FIG. 1, the apparatus for producing an organic EL device, provided by the present invention, has an ozonizer 1, a duct 2 for transporting generated ozone gas from the ozonizer, a cleaning chamber 3 for cleaning with the ozone gas, an organic-layer-forming chamber 4 for forming an organic layer, an electrode-sputtering chamber 5 for forming an electron-injecting electrode on an formed organic layer, a protective-electrode-layer-forming chamber 6 for forming a protective electrode on an electron-injecting electrode, an airtight working chamber 7 connecting the layer-forming chambers and being for transporting a substrate from one layer-forming chamber to another, and a loader-unloader 8. Further, each of the cleaning chamber 3, the organic-layer-forming chamber 4, the electrode-sputtering chamber 5 and the protective-electrode-layer-forming chamber 6 has closure means (not shown) such as a shutter, so that these chambers can be opened to and closed from the airtight working chamber 7 as required. Further, the airtight working chamber 7, etc., are pressure-decreased to a predetermined degree of vacuum for easing successive operations and preventing the inclusion of dust, etc., and these chambers are maintained airtightly and have transport means, such as a transport arm, necessary for transporting a substrate. Each layer-forming chamber and the loader-unloader are disposed radially with regard to the airtight working chamber for effective transportation.

In the above-structured production apparatus, a substrate on which a layer of a hole-injecting electrode is formed is introduced with the loader-unloader 8, and it is transported into the cleaning chamber 3 through the airtight working chamber 7. The pressure in the cleaning chamber 3 is maintained at a predetermined reduced pressure, and when the substrate is placed therein, the cleaning chamber is shut off from the airtight working chamber 7 with closure means, and ozone is supplied from the ozonizer 1 through the duct 2. The time period of the cleaning this time is preferably 1 to 30 minutes, particularly preferably 2 to 5 minutes. Further, during the cleaning, a state of reduced pressure is maintained. When the cleaning is finished, the closure means is opened, and the substrate is transported into the organic-layer-forming chamber 4 through the airtight working chamber 7. In this case, the pressure inside the cleaning chamber is maintained at a predetermined vacuum degree, and therefore, it is not necessary to resume the pressure-decreasing procedure, or even if the pressure is decreased, not much time for decreasing the pressure is required.

In the organic-layer-forming chamber 4, the substrate is transported thereinto, and then the organic-layer-forming chamber 4 is shut off from the airtight working chamber 7 with closure means. The pressure therein is decreased to a predetermined degree of vacuum, and organic layers such as a hole-injecting/transporting layer, a light-emitting layer, an electron injecting/transporting layer, etc., are formed by vacuum deposition or sputtering. In the electrode-sputtering chamber 5, an electron-injecting electrode is similarly formed on the substrate on which an organic EL structure is formed. Further, in the protective-electrode-layer-forming chamber 6, a protective electrode is formed on the electron-injecting electrode, and then, the so-obtained structure is transported out through the loader-unloader 8 and treated as required, whereby an organic EL device is provided. As described above, the inside of the cleaning chamber can be maintained in a pressure-reduced state, and a high concentration of ozone gas in a large amount can be supplied with the ozonizer, whereby the cleaning can be carried out for a very short period of time and the location of the ozonizer can be selected without any limitation, so that the units of the apparatus can be effectively arranged as shown in the example in FIG. 1 and that the work efficiency is remarkably improved in successive steps of producing the organic EL device.

In the above example, explanations are given with regard to the successive steps of cleaning with ozone and forming layers such as organic layers, etc., while the apparatus shall not be limited to the above constitution. A working chamber for forming a layer of the hole-injecting electrode may be connected to the same airtight working chamber 7, the layer-forming chamber and the cleaning chamber may be of one chamber, and the constitution and the location of these can be properly determined depending upon the scale and the specification required of an apparatus for production.

An organic EL device produced by means of the apparatus of the present invention will be explained below.

The organic EL device obtained according to the present invention has a hole-injecting electrode on a substrate, an electron-injecting electrode and at least one organic layer formed between these electrodes. The organic layers include at least one hole-transporting layer, at least one light-emitting layer and an electron-injecting electrode thereon, and a protective electrode may be provided as an uppermost layer. The hole-transporting layer can be omitted. The electron-injecting electrode is constituted of a layer formed from a metal, a compound or an alloy having a small work function by a vapor deposition or sputtering method, preferably by a sputtering method.

Figure 2:
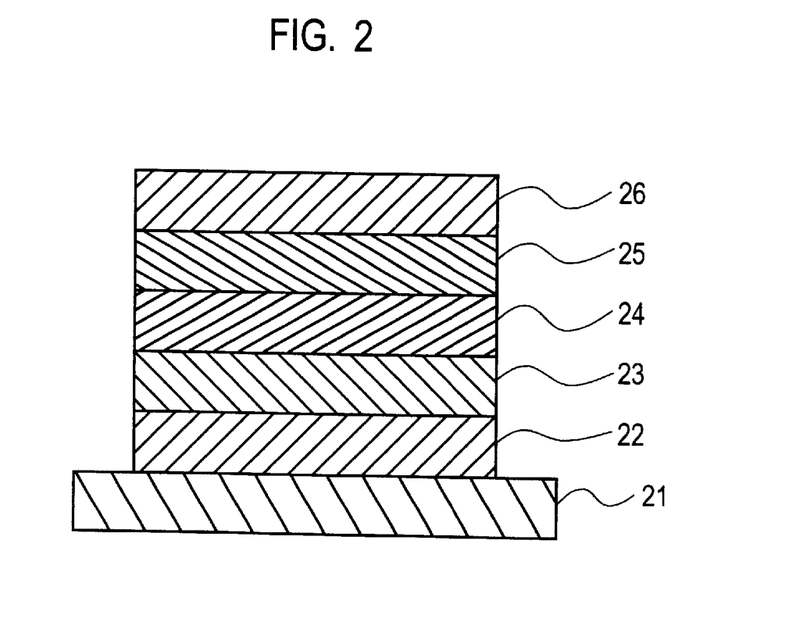
FIG. 2 is a schematic cross-sectional view of one constitution example of an organic EL device in the present invention.

FIG. 2 shows a constitution example of the organic EL device produced according to the present invention. The organic EL device shown in FIG. 2 has a substrate 21, a hole-injecting electrode 22, a hole-injecting layer 23, a hole-transporting layer 24, a light-emitting layer 25, an electron-injecting layer 26, an electron-injecting electrode and a protective electrode, and these layers are consecutively formed on the substrate 21. The organic EL device is not limited to the constitution example shown in FIG. 2, and it may have various constitutions.

The hole-injecting electrode is preferably a transparent electrode since an organic EL device generally has a structure in which emitted light comes out through a substrate side. The material for the hole-injecting electrode includes ITO (tin-doped indium oxide), IZO (zinc-doped indium oxide), ZnO, $SnO_2$ and $In_2O_3$. It is preferably ITO (tin-doped indium oxide) or IZO (zinc-doped indium oxide). The mixing ratio of $SnO_2$ based on $In_2O_3$ is preferably 1 to 20% by weight, more preferably 5 to 12% by weight. The mixing ratio of ZnO based on the $In_2O_3$ is preferably 1 to 20% by weight, more preferably 5 to 12% by weight. The hole-injecting electrode may further contain Sn, Ti and Pb in the form of oxides in an amount of 1% by weight or less as oxides.

The hole-injecting electrode may be formed by a vapor deposition method, etc., while it is preferably formed by a sputtering method. When the ITO or IZO electrode is formed by a sputtering method, preferably, a target prepared by doping $In_2O_3$ with $SnO_2$ or ZnO is used. When a layer of the ITO transparent electrode is formed by a sputtering method, the change of the luminance with the passage of time is small as compared with a case where it is formed by a vapor deposition method. The sputtering method is preferably a DC sputtering method, and the input power in the sputtering method is preferably in the range of from 0.1 to 4 $W/cm^2$. In particular, the power for the DC sputtering apparatus is preferably in the range of from 0.1 to 10 $W/cm^2$, particularly preferably 0.2 to 5 $W/cm^2$. Further, the layer-forming rate is preferably in the range of from 2 to 100 nm/minute, particularly preferably 5 to 50 nm/minute.

The sputtering gas is not specially limited, and it can be selected from inert gases such as Ar, He, Ne, Kr and Xe gases or from mixtures of these. Generally, the pressure of the sputtering gas during the sputtering can be approximately 0.1 to 20 Pa.

The thickness of the hole-injecting electrode is not critical so long as hole injection can be sufficiently performed, and generally, it is preferably in the range of from 5 to 500 nm, particularly preferably 10 to 300 nm.

The material for constituting the electron-injecting electrode is preferably selected from materials having a low work function for performing effective electron-injection. Examples of the above material preferably include simple substances of metal elements such as K, Li, Na, Mg, La, Ce, Ca, Sr, Ba, Al, Ag, In, Sn, Zn, Zr, Cs, Er, Eu, Ga, Hf, Nd, Rb, Sc, Sm, Ta, Y and Yb, and compounds such as BaO, BaS, CaO, HfC, $KaB_6$, MgO, MoC, NbC, PbS, SrO, TaC, ThC, $ThO_2$, ThS, TiC, TnN, UC, UN, $UO_2$, $W_2C$, $Y_2O^3$, ZrC, ZrN and $ZrO_2$. For improving stability, it is preferred to use a two-component or three-component ally containing a metal element. Examples of the alloy preferably include aluminumcontaining alloys such as Al.Ca (Ca: 5 to 20 at %), Al.In (In: 1 to 10 at %), Al.Li (Li: 0.1 to 20 at %) and Al.R (R is a rare earth metal element including Y and Sc) and In-Mg (Mg: 50 to 80 at %). Of these, a simple substance of Al or an aluminum-containing alloy such as Al.Li (Li: 0.4 to 6.5 (6.5 is not inclusive) at %) or (Li: 6.5 to 14 at %) or Al.R (R: 0.1 to 25, particularly 0.5 to 20 at %) is preferred since a compressive stress hardly occurs. Generally, the sputtering target is therefore selected from the above metals and alloys for constituting the electron-injecting electrode. These materials have a work function of 4.5 eV or less, and metals and alloys having a work function of 4.0 eV or less are particularly preferred.

When the sputtering method is employed for forming a layer of the electron-injecting electrode, the formed electron-injecting electrode layer has improved adhesion in the interface to an organic layer as compared with a case where it is formed by vapor deposition, since atoms or atomic groups sputtered have relatively high kinetic energy so that a surface migration effect works. Further, by carrying out pre-sputtering, a surface oxide layer can be removed in vacuum, or by carrying out reverse sputtering, water and oxygen adsorbed on the interface to an organic layer can be removed, so that clean electrode-organic layer interface and electrode can be formed. As a result, a high-quality and stable organic EL device can be produced. The target may be an alloy having a composition in the above composition range or the above metal alone, and a target containing an additive component in addition thereto may be used. Further, even when a mixture of materials having greatly different vapor pressures is used as a target, the difference between the composition of a layer formed and the composition of the target is small, and unlike a vapor deposition method, there is no limitation which is to be imposed on the material to be used because of vapor pressures, etc. Further, as compared with a vapor deposition method, it is not required to supply the material for a long period of time, and a formed layer is excellent in thickness and quality, which are advantageous in productivity.

The electron-injecting electrode formed by the sputtering method is a dense layer, and as compared with a coarse layer formed by vapor deposition, it is remarkably free from the infiltration of water into the layer. There can be therefore obtained an organic EL device having high chemical stability and a long lifetime.

The pressure of the sputtering gas during the sputtering is preferably in the range of from 0.1 to 5 Pa. When the pressure of the sputtering gas is adjusted in the above range, an AlLi alloy having an Li concentration in the above range can be easily obtained. Further, when the pressure of the sputtering gas during the sputtering is changed within the above range, an electron-injecting electrode having the above Li concentration gradient can be easily obtained. Further, preferably, the condition of forming the layer is set such that the product of a layer-forming gas pressure and a distance between the substrate and the target satisfies 20 to 65 Pa.cm.

The sputtering gas is selected from inert gases used with general sputtering apparatus, and the gas for reactive sputtering can be selected from reactive gases such as $N_2$, $H_2$, $O_2$, $C_2H_4$ and $NH_3$ in addition to the above inert gases.

As a sputtering method, there may be employed a high-frequency sputtering method using an RF power source, while it is preferred to use a DC sputtering method since the rate of forming a layer can be easily controlled and since damage to the organic EL device structure can be decreased. The power for the DC sputtering apparatus is preferably in the range of from 0.1 to 10 $W/cm^2$, particularly preferably 0.5 to 7 $W/cm^2$. Further, the rate of forming a layer of the electron-injecting electrode is preferably in the range of from 5 to 100 nm/minute, particularly preferably 10 to 50 nm/minute.

The thickness of the electron-injecting electrode layer is not critical so long as electron injection can be sufficiently performed, and it is at least 1 nm, preferably at least 3 nm. Further, although no specially limited, the upper limit thereof is generally approximately 3 to 500 nm.

In the organic EL device of the present invention, on the electron-injecting electrode, i.e., on the surface opposite to the organic layer, a protective electrode may be provided. The protective electrode protects the electron-injecting electrode from atmosphere, water, etc., prevents the deterioration of constituting thin layers and stabilizes the electron injection efficiency, and the lifetime of the device is remarkably improved. Further, the protective electrode has a low resistance, and has a function as a wiring electrode when the electron-injecting electrode has a high resistance. The protective electrode contains Al, a combination of Al with a transition metal (excluding Ti) or at least one of Ti and titanium nitride (TiN). When these are used alone, preferably, the protective electrode contains approximately 90 to 100 at % of Al, approximately 90 to 100 at % of Ti, or approximately 90 to 100 mol % of TiN. When at least two of them are used, the mixing ratio thereof is not critical. When a mixture of Al and Ti is used, however, the content of Ti is preferably 10 at % or less. Further, layers containing these alone may be laminated. In particular, Al and a combination of Al with a transition metal give an excellent results when used as a wiring electrode to be described later. TiN has high corrosion resistance and has a high effect as a sealing layer. The composition of TiN may be deviated from its stoichiometric composition approximately by 10%. Further, the alloy of Al and a transition metal may contain a transition metal, particularly, Sc, Nb, Zr, Hf, Nd, Ta, Cu, Si, Cr, Mo, Mn, Ni, Pd, Pt and W, preferably in a total amount of 10 at % or less, more preferably 5 at % or less, particularly preferably 2 at % or less. With a decrease in the content of the transition metal, the thin layer resistance decreases when the protective electrode is to function as a wiring material.

The thickness of the protective electrode can be equal to, or greater than, a certain thickness for securing an electron injection efficiency and preventing the infiltration of water, oxygen or an organic solvent. It is preferably at least 50 nm, more preferably at least 100 nm, particularly preferably in the range of from 100 to 1,000 nm. When the thickness of the protective electrode is too small, no effect of the present invention can be obtained. Further, the protective electrode layer is less capable of coating a height difference, and the connection to a terminal electrode is no longer sufficient. When the thickness of the protective electrode is too large, a stress of the protective layer is large, and the rate of growth of dark spots increases. When the protective electrode is to function as a wiring electrode, it has a high layer resistance since the thickness of the electron-injecting electrode is small. For its compensation, the thickness of the protective electrode is generally approximately 100 to 500 nm, and when the protective electrode is to function as other wiring electrode, the above thickness is approximately 100 to 300 nm.

Although not specially limited, the total thickness of the electron-injecting electrode and the protective electrode can be generally 100 to 1,000 nm.

After the layer of the electrode is formed, a protective layer may be formed from an inorganic material such as SiOx or an organic material such as Teflon or a chlorine-containing carbon fluoride polymer in addition to the above protective electrode. The protective layer may be transparent or opaque, and the thickness of the protective layer is approximately 50 to 1,200 nm. The protective layer can be formed by the above reactive sputtering method, or it can be formed by any one of a general sputtering method, a vapor deposition method and a PECVD method.

Further, it is preferred to form a sealing layer on the device for preventing the oxidation of the organic layer and the electrode of the device. The sealing layer is formed to seal the device for preventing the infiltration of moisture, by bonding a sealing plate such as a glass plate with an adhesive resin layer of a commercially available low-hygroscopicity photo-curable adhesive, an epoxy adhesive, a silicone adhesive or a crosslinked ethylene-vinyl acetate copolymer adhesive sheet. Besides the glass plate, a metal plate or a plastic plate may be used.

The organic layers of the EL device of the present invention will be explained below.

The light-emitting layer functions for the injection of holes and electrons, functions for the transportation thereof and functions for the generation of excitons by recombination of holes and electrons. The light-emitting layer is preferably formed from a compound which is relatively neutral with regard to electrons.

The hole-injecting/transporting layer functions for easing the injection of holes from the hole-injecting layer, functions for the stable transportation of holes and functions for blocking electrons. The electron-injecting/transporting layer functions for easing the injection of electrons from a cathode, functions for the stable transportation of electrons and functions for blocking holes. These layers increase or confine holes or electrons to be injected into the light-emitting layer, optimize a recombination region and improve the light emission efficiency.

The thickness of the light-emitting layer, the thickness of the hole-injecting/transporting layer and the thickness of the electron-injecting/transporting layer are not specially limited, and they also differ depending upon methods of forming them. Generally, the thickness of each is preferably approximately 5 to 500 nm, particularly preferably 10 to 300 nm.

The thickness of the hole-injecting/transporting layer and the thickness of the electron-injecting/transporting layer are determined depending upon a design of a recombination/light emission region, while they can be approximately equal to, or $\frac{1}{10}$ to 10 times, the thickness of the light-emitting layer. When the hole- or electron-injecting/transporting layer is separated into an injecting layer and a transporting layer, preferably, the injecting layer has a thickness of at least 1 nm and the transporting layer has a thickness of at least 1 nm. The upper limits of the thickness of the injecting layer and the transporting layer are approximately 500 nm for the injecting layer and approximately 500 nm for the transporting layer. The above thickness limitation also applies when two injecting/transporting layers are formed.

In the organic EL device of the present invention, the light-emitting layer contains a fluorescent material which is a compound having a light emission function. The fluorescent material is at least one compound selected from compounds disclosed in JP-A-63-264692, such as quinacridone, rubrene and styryl-containing dyestuffs. Further, the above compound includes quinolin derivatives such as metal complex dyestuffs containing, as a ligand, 8-quinolinol or its derivative, such as tris(8-quinolnolato)aluminum, tetraphenylbutadiene, anthracene, perylene, coronene and 12-phthaloperinone derivatives. Further, the above compound can be selected from phenylanthracene derivatives described in Japanese Patent Application No. 6-110569 and tetraarylethene derivatives described in Japanese Patent Application No. 6-114456.

Further, the above compound is preferably used in combination with a host material which can emit light by itself, and it is preferably used as a dopant. In this case, the content of the above compound in the light-emitting layer is preferably 0.01 to 10% by weight, more preferably 0.1 to 5% by weight. When used in combination with a host material, the above compound can change the light emission wavelength characteristic of the host material and makes it possible to emit light shifted toward a long wavelength, and further, the device is improved in light emission efficiency and stability.

The host material is preferably selected from quinolinolate complexes, more preferably selected from aluminum complexes containing 8-quinolinol or its derivative as a ligand. The above aluminum complexes include those disclosed in JP-A-63-264692, JP-A-3-255190, JP-A-5-70733, JP-A-5-258859 and JP-A-6-215874.

Specific examples of the above quinolinolate complexes include aluminum tris(8-quinolinolato)aluminum, bis(8-quinolinolato)magnesium, bis(benzo{f}-8-quinolinolato)zinc, bis(2-methyl-8-quinolinolato)aluminum oxide, tris(8-quinolinolato)indium, tris(5-methyl-8-quinolinolato)aluminum, 8-quinolinolatolithium, tris(5-chloro-8-quinolinolato)gallium, bis(5-chloro-8-quinolinolato)calcium, 5,7-dichloro-8-quinolinolatoaluminum, tris(5,7-dibromo-8-hydroxyquinolinolato)aluminum and poly[zinc (II)-bis(8-hydroxy-5-quinolinyl)methane].

Further, the host material may be an aluminum complex containing other ligand in addition to 8-qunilinol or its derivative. Examples of the above aluminum complex include bis(2-methyl-8-quinolinolato)(phenolato)aluminum (III), bis(2-methyl-8-quinolinolato)(o-cresolato)aluminum (III), bis(2-methyl-8-quinolinolato)(m-cresolato)aluminum (III), bis(2-methyl-8-quinolinolato)(p-cresolato)aluminum (III), bis(2-methyl-8-quinolinolato)(ophenylphenolato)aluminum (III), bis(2-methyl-8-quinolinolato)(m-phenylphenolato)aluminum (III), bis(2-methyl-8-quinolinolato)(p-phenylphenolato)aluminum (III), bis(2-methyl-8-quinolinolato)(2,3-dimethylphenolato)aluminum (III), bis(2-methyl-8-quinolinolato)(2,6-dimethylphenolato)aluminum (III), bis(2-methyl-8-quinolinolato)(3,4-dimethylphenolato)aluminum (III), bis(2-methyl-8-quinolinolato)(3,5-dimethylphenolato)aluminum (III), bis(2-methyl-8-quinolinolato)(3,5-di-tertbutylphenolato)aluminum (III), bis(2-methyl-8-quinolinolato)(2,6-diphenylphenolato)aluminum (III), bis(2-methyl-8-quinolinolato)(2,4,6-triphenylphenolato)aluminum (III), bis(2-methyl-8-quinolinolato)(2,3,6-trimethylphenolato)aluminum (III), bis(2-methyl-8-quinolinolato)(2,3,5,6-tetramethylphenolato)aluminum (III), bis(2-methyl-8-ouinolinolato) (1-naphtholato)aluminum (III), bis(2-methyl-8-quinolinolato)(2-naphtholato)aluminum (III), bis(2,4-dimethyl-8-quinolinolato)(o-phenylphenolato)aluminum (III), bis(2,4-dimethyl-8-quinolinolato)(pphenylphenolato)aluminum (III), bis(2,4-dimethyl-8-quinolinolato)(m-phenylphenolato)aluminum (III), bis(2,4-dimethyl-8-quinolinolato)(3,5-dimethylphenolato)aluminum (III), bis (2,4-dimethyl-8-quinolinolato)(3,5-di-tertbutylphenolato) aluminum (III), bis(2-methyl-4-ethyl-8-quinolinolato)(p-cresolato)aluminum (III), bis(2-methyl-4methoxy-8-quinolinolato)(p-phenylphenolato)aluminum (III), bis(2-methyl-5-cyano-8-quinolinolato)(o-cresolato)aluminum (III) and bis(2-methyl-6-trifluoromethyl-8-quinolinolato) (2-naphtholato)aluminum (III).

Further, the host material includes bis(2-methyl8-quinolinolato)aluminum (III)-$\mu$-oxo-bis(2-methyl-8-quinolinolato)aluminum (III), bis(2,4-dimethyl-8-quinolinolato)aluminum (III)-$\mu$-oxo-bis(2,4-dimethyl-8-quinolinolato)aluminum (III), bis(4-ethyl-2-methyl-3-quinolinolato)aluminum (III)-$\mu$-oxo-bis(4-ethyl-2-methyl-8-quinolinolato)aluminum (III), bis(2-methyl-4-methoxyquinolinolato)aluminum (III)-$\mu$-oxo-bis(2-methyl-4-methoxyquinolinolato)aluminum (III), bis(5-cyano-2-methyl-8-quinolinolato)aluminum (III)-$\mu$-oxo-bis(5-cyano-2-methyl-8-quinolinolato)aluminum (III) and bis(2-methyl-5-trifluoromethyl-8-quinolinolato)aluminum (III)-$\mu$-oxo- bis (2-methyl-5-trifluoromethyl-8-quinolinolato)aluminum (III).

As other host material, the host material is preferably selected from phenylanthracene derivatives described in Japanese Patent Application No. 6-110569 and tetraarylethene derivatives described in Japanese Patent Application No. 6-114456.

The light-emitting layer may be a layer which also works as an electron-injecting/transporting layer. In this case, it is preferred to use tris(8-quinolinolato)aluminum, and the like. It can be formed by vapor deposition of these fluorescent materials.

The light-emitting layer is also preferably a mixture layer containing at least one compound capable of hole injection/transportation and at least one compound capable of electron injection/transportation, and the mixture layer preferably contains the dopant. The amount of the compounds in the mixture layer is preferably 0.01 to 20% by weight, more preferably 0.1 to 15% by weight.

In the mixture layer, since a hopping transmission path for carriers is formed, each carrier moves through a substance having a dominant polarity, the occurrence of injection of carriers having a reverse polarity is difficult, organic compounds scarcely suffer damage, and advantageously, the lifetime of the device increases. By incorporating the above dopant into the above mixture layer, the light emission wavelength characteristics of the mixture layer itself can be changed, and the wavelength of light to be emitted can be shifted toward a longer wavelength. Further, the light emission intensity can be increased, and the device can be improved in stability.

The compound capable of hole injection/transportation and the compound capable of electron injection/transportation, used in the mixture layer, can be selected from compounds for hole injection/transportation and compounds for electron injection/transportation to be described later. Of these, as a compound capable of hole injection/transportation, it is preferred to use an amine derivative having intense fluorescence, such as a triphenyldiamine derivative which is a hole-transporting material, and further, it is also preferred to use a styrylamine derivative or an amine derivative having fused aromatic rings.

As a compound capable of electron injection/transportation, it is preferred to use a metal complex containing, as a ligand, a quinoline derivative, 8-quinolinol or its derivative, and it is particularly preferred to use tris(8-quinolinolato)aluminum (Alq3). It is also preferred to select the above compound from the above phenylanthracene derivatives or tetraarylethene derivatives.

As a compound for hole injection/transportation, it is preferred to use an amine derivative having intense fluorescence, such as a triphenyldiamine derivative which is the above material for hole transportation, and further, it is also preferred to use a styrylamine derivative or an amine derivative having fused aromatic rings.

In this case, the mixing ratio is determined by taking account of the carrier mobility and carrier concentration of each compound. Generally, the mixing ratio is preferably determined such that the weight ratio of the compound capable of hole injection and transportation/compound having electron injection and transportation function is 1/99 to 99/1, more preferably 10/90 to 90/10, particularly preferably 20/80 to 80/20.

The thickness of the mixture layer is preferably from a thickness corresponding to a single-molecular layer to less than the thickness of the organic compound layer. Specifically, it is preferably 1 to 85 nm, more preferably 5 to 60 nm, particularly preferably 5 to 50 nm.

The mixture layer is formed preferably by a vapor co-deposition method in which compounds are vaporized from different vaporization sources. When the compounds have vapor pressures (vaporization temperature) similar to, or very close to, each other, they may be pre-mixed in a common vaporization boat for deposition. The mixture layer is preferably a layer of a uniform mixture of the compounds, while it may be a layer in which the compounds are present in the state of islands. Generally, the light-emitting layer is formed to a predetermined thickness by depositing an organic fluorescent material or coating a dispersion of an organic fluorescent material in a resin binder.

The material for the hole-injecting/transporting layer can be selected, for example, from various organic compounds described in JP-A-63-295695, JP-A-2-191694, JP-A-3-792, JP-A-5-234681, JP-A-5-239455, JP-A-5-299174, JP-A-7126225, JP-A-7-126226, JP-A-8-100172 and EP0650955A1, such as tetraarylbenzidine compounds (triaryldiamine or triphenyldiamine: TPD), aromatic tertiary amines, hydrazone derivatives, carbazole derivatives, triazole derivatives, imidazole derivatives, amino-group-possessing oxadiazole derivatives and polythiophene. These compounds may be used in combination. When used in combination, the compounds may be used to form separate layers or a mixture layer.

When the hole-injecting/transporting layer is formed by separating it into a hole-injecting layer and a hole-transporting layer, a preferred combination of compounds can be selected from compounds for the hole-injecting/transporting layers. In this case, it is preferred to laminate layers in such an order that a layer of a compound having a lower ionization potential is disposed on the hole-injecting electrode (ITO, etc.) side. Further, it is preferred to use a compound having excellent thin layer formability on the anode surface. The above lamination order also applies when the hole-injecting/transporting layer is formed as at least two layers. The above lamination order serves to decrease a drive voltage and prevent the occurrence of current leak and the occurrence and growth of dark spots. Further, vapor deposition is used for forming the device, a thin layer having a thickness of approximately 1 to 10 nm can be formed as a uniform and pin-hole-free layer. As a result, the change in color tone of light emission and a decrease in efficiency caused by re-absorption can be prevented even when a compound having a low ionization potential and absorption in a visible light region is used for the hole-injecting layer. The hole-injecting/transporting layer can be formed by vapor deposition of the above compounds in the same manner as in the formation of the light-emitting layer.

Further, the material for the electron-injecting/transporting layer which is formed as required can be selected from quinoline derivatives such as organic metal complexes containing, as a ligand, 8-quinolinol or its derivative, such as tris(8-quinolinolato)aluminum (Alq3), oxadiazole derivatives, perylene derivatives, pyridine derivatives, pyrimidine derivatives, quinoxaline derivatives, diphenylquinone derivatives and nitro-substituted fluorene derivatives. The electron-injecting/transporting layer may be a layer which also works as a light-emitting layer as well. In this case, it is preferred to use tris(8-quinolinolato) aluminum, etc. The electron-injecting/transporting layer can be formed by vapor deposition in the same manner as in the formation of the light-emitting layer.

When the electron-injecting/transporting layer is formed by separating it into an electron-injecting layer and an electron-transporting layer, a preferred combination of compounds can be selected from compounds for the electron-injecting/transporting layers. In this case, it is preferred to laminate layers in such an order that a layer of a compound having a greater value of electron affinity is disposed on the electron-injecting electrode side. The above lamination order also applies when the electron-injecting/transporting layer is formed as at least two layers.

The emitted light may be color-controlled by using a color filter layer, a color conversion layer containing a fluorescent material or a dielectric reflection layer as/on the substrate.

The color filter can be selected from color filters used with a liquid crystal display, etc., and can be adjusted in characteristics depending upon light emitted from the organic EL to optimize extraction efficiency and color purity.

When there is used a color filter capable of cutting short-wavelength light which is absorbed in the EL device materials and the fluorescence conversion layer, the device is improved in light resistance and display contrast.

Further, an optical thin layer such as a multilayer dielectric layer may be substituted for the color filter.

The fluorescence conversion filter layer absorbs light of EL and emits light from the fluorescence in the fluorescence conversion layer to perform color conversion of the emitted light. It is formed from three components; a binder, a fluorescent material and a light-absorbing material.

The fluorescent material can be basically selected from those having a high fluorescent quantum yield, and desirably, it has strong absorption in the EL wavelength region. In practice, laser dyestuffs are suitable, and it can be selected from Rhodamine compounds, perylene compounds, cyanine compounds, phthalocyanine compounds (including sub-phthalocyanines), naphthalimide compounds, fused-ring hydrocarbon compounds, fused-ring heterocyclic compounds, styryl compounds and coumarin compounds.

The binder can be basically selected from materials which cause no extinction of fluorescence, and preferably, it permits a fine patterning by photolithography or printing. Further, preferably, it is free from damage caused during the formation of a layer of ITO or IZO.

The light-absorbing material is used when the light absorption of the fluorescent material is insufficient. It may be omitted when unnecessary. Further, the light-absorbing material can be selected from those which cause no extinction of fluorescence of the fluorescent material.

For forming the hole-injecting/transporting layer, the light-emitting layer and the electron-injecting/transporting layer, it is preferred to use a vacuum vapor deposition method since uniform thin layers can be formed. The vacuum vapor deposition method gives a uniform thin layer having an amorphous state or having a crystal grain size of 0.1 µm or less. When the crystal grain size exceeds 0.1 µm, the device results in non-uniform light emission, it is required to increase the drive voltage of the device, and the electric charge injection efficiency decreases.

The conditions for the vacuum vapor deposition are not specially limited, while it is preferred to employ a vacuum degree of $10^{-4}$ Pa or less and a deposition rate of 0.01 to 1 nm/second. It is also preferred to form layers in vacuum successively. The successive formation of the layers serves to prevent the adsorption of impurities in layer interfaces and therefore secures higher performances. Further, it serves to decrease the drive voltage of the drive and to prevent the growth and occurrence of dark spots.

When the vacuum vapor deposition method is used for forming each layer, and when a plurality of compounds are used for forming a single layer, the layer is preferable formed by vapor co-deposition by controlling the temperature of each boat with a compound in it separately from other.

The organic EL device of the present invention is generally used as a DC drive type device, while it may be a device of an AC drive type or a pulse drive type. The applied voltage is generally set approximately at 2 to 20 V.

EFFECT OF THE INVENTION

The present invention provides an apparatus and a process for the production of an organic EL device, which permits a high freedom of apparatus designing, permits effective processing and gives an organic EL device having a high light emission efficiency and excellent device characteristics.

EXAMPLES

The present invention will be explained in detail with reference to Examples hereinafter.

Example 1

On a glass substrate, an ITO transparent electrode (hole-injecting electrode) was layer-formed and patterned so as to constitute pixels of 64 dots×7 lines (280×280 µm per pixel) having a layer thickness of 85 nm. Then, the substrate having the patterned hole-injection electrode formed was ultrasonically washed with a neutral detergent, with acetone and with ethanol, and it was taken up from the boiling ethanol and dried. Then, the dry substrate was transported into a cleaning chamber, and the surface of the substrate was $O_3$-cleaned with an ozonizer for 5 minutes. In this case, $O_2$+$N_2$ gases were used as feed gas, and the gas flow rates were 1 Nl/minute of $O_2$ and 10 Ncc/minute of $N_2$. The ozone gas which was generated had a concentration of 7 g/h. The atmospheric pressure in the cleaning chamber was 6.65×10³ Pa.

Then, the substrate was transferred from the cleaning chamber into a layer-forming chamber and fixed to a substrate holder of a vacuum vapor deposition apparatus, and the pressure in the chamber was reduced to 1×10⁴ Pa or less. 4,4', 4"-tris(-N-(3-methylphenyl)-Nphenylamino) triphenylamine (m-MTDATA) was vapor-deposited at a deposition rate of 0.2 nm/second to form a hole-injecting layer having a thickness of 40 nm, and then, while the reduced pressure state was maintained, N,N'-diphenyl-N, N7-m-tolyl-4,4'-diamino-1,1'-biphenyl ("TPD" hereinafter) was vapor-deposited at a deposition rate of 0.2 nm/second to form a hole-injecting layer having a thickness of 35 nm. Further, while the reduced pressure state was maintained, tris(8-quinolinolato)aluminum ("Alq3" hereinafter) was vapor-deposited at a deposition rate of 0.2 nm/second to form an electron-injecting/transporting and light-emitting layer having a thickness of 50 nm. Then, while the reduced pressure state was maintained, MgAg was vapor co-deposited (two-element deposited) at a deposition rate ratio Mg:Ag of 1:10 to form an electron-injecting electrode having a thickness of 200 nm. Further, while the the reduced pressure state was maintained, the EL device substrate was transferred to a sputtering apparatus, and a layer of Al protective electrode was formed to a thickness of 200 nm by a DC sputtering method using an Al target at a sputtering pressure of 0.3 Pa. In the sputtering, Ar was used as a sputtering gas, the input power was 500 W, the target has a size of 4 inches in diameter, and the distance between the substrate and the target was set at 90 mm. Finally, a glass material as a sealing plate was bonded with an adhesive and spacers having a predetermined size, to seal the device.

A DC voltage was applied to the above-obtained organic EL device in atmosphere to drive the device at a constant current density of 10 mA/cm², to show a drive voltage of 6.5 V and a luminance of 350 cd/m². Further, the device was evaluated for a half-luminance time under accelerated conditions of 60° C. in temperature and 95% in humidity, to show 700 hours.

Example 2

In Example 1, the cleaning with the ozonizer was replaced with cleaning with a UV lamp, and there was measured a time period required for obtaining a cleaning effect equivalent to that in Example 1, to show that the cleaning with the UV lamp required 30 minutes or more.

Comparative Example 1

An organic EL device was obtained in the same manner as in Example 1 except that the substrate having the hole-injecting electrode formed was not cleaned with the ozonizer.

A DC current was applied to the above-obtained organic EL device to drive the device at a constant current density of 10 mA/cm² in the same manner as in Example 1, to show a drive voltage 7.1 V and a luminance of 300 cd/m². Further, the device was evaluated for a half-luminance time under accelerated conditions of 60° C. in temperature and 95% in humidity, to show 300 hours.

Japanese Patent Application No. 215758/1997 is herein incorporated by reference.

What is claimed is:

1. A process for the production of an organic electroluminescent device, comprising     forming a hole-injecting electrode on a substrate,     cleaning the substrate on which the hole-injecting electrode is formed, with ozone generated in the range of 1 to 30 g/h with feed gases of $O^2$ at a flow rate of no more than 3 Nl/min and $N_2$ at a flow rate of no more than 30 Ncc/min using an ozonizer under a reduced pressure of $1.33\times10^4$ Pa or less, and forming an organic layer on said electrode.

2. A process as recited in claim 1, comprising forming the organic layer within 60 minutes from the cleaning.

3. A process as recited in claim 2, comprising forming the organic layer within 10–30 minutes from the cleaning.

4. A process as recited in claim 1, comprising cleaning the substrate with ozone for about 2–5 minutes.

5. A process as recited in claim 1, comprising cleaning the substrate with ozone for less than 10 minutes.

6. A process as recited in claim 1, comprising:

cleaning the substrate in a first chamber under a reduced pressure;

transporting the substrate through an airtight working chamber to a second chamber for forming the organic layer after the cleaning step while maintaining a reduced pressure.

7. A process as recited in claim 1, comprising:

forming the hole-injecting electrode on the substrate in a first chamber; and cleaning the substrate in said first chamber.

8. A process as recited in claim 7, comprising:

generating the ozone in an ozonizer; and supplying the ozone from the ozonizer to the first chamber.

9. A process as recited in claim 1, comprising:

cleaning said substrate with ozone generated with an ozonizer under a reduced pressure in the range of $1.33\times10^4$ Pa to $1.33\times10^2$ Pa.

10. A process as recited in claim 1, comprising:

generating ozone in the range of 5 to 10 g/h.

11. A process as recited in claim 1, comprising:

cleaning the substrate with ozone generated at a rate of approximately 20 g/h.

12. A process as recited in claim 1, comprising:

cleaning the substrate with ozone generated at a rate of approximately 25 g/h.

13. A process for the production of an organic electroluminescent device, comprising forming a hole-injecting electrode on a substrate in a first chamber, cleaning the substrate on which the hole-injecting electrode is formed, with ozone generated with feed gases of $O^2$ at a flow rate of no more than 3 Nl/min and $N_2$ at a flow rate of no more than 30 Ncc/min using an ozonizer in the first chamber, and forming an organic layer on said electrode.

14. A process as recited in claim 13 comprising:

generating the ozone in a second chamber; and supplying the ozone from the second chamber to the first chamber.

15. A process as recited in claim 13 comprising cleaning said substrate with ozone at a pressure of $1.33\times10^4$ to $1.33\times10^2$ Pa.

16. A process as recited in claim 13, comprising:

cleaning the substrate with ozone generated at a rate of approximately 20 g/h.

17. A process as recited in claim 13, comprising:

cleaning the substrate with ozone generated at a rate of approximately 25 g/h.

* * * * *

UNITED STATES PATENT AND TRADEMARK OFFICE
CERTIFICATE OF CORRECTION

PATENT NO. : 6,333,065 B1  
DATED : December 25, 2001  
INVENTOR(S) : Michio Arai et al.

It is certified that error appears in the above-identified patent and that said Letters Patent is hereby corrected as shown below:

Column 15,  
Line 1, change "$O^2$" to -- $O_2$ --

Column 16,  
Line 15, change "$O^2$" to -- $O_2$ --

Signed and Sealed this

Sixteenth Day of July, 2002

Attest:

Attesting Officer

JAMES E. ROGAN  
*Director of the United States Patent and Trademark Office*